United States Patent [19]

Nishi

[11] Patent Number: 4,880,310
[45] Date of Patent: Nov. 14, 1989

[54] OPTICAL DEVICE FOR ALIGNMENT IN A PROJECTION EXPOSURE APPARATUS

[75] Inventor: Kenji Nishi, Kawasaki, Japan

[73] Assignee: Nikon Corporation, Tokyo, Japan

[21] Appl. No.: 287,559

[22] Filed: Dec. 20, 1988

Related U.S. Application Data

[63] Continuation of Ser. No. 76,740, Jul. 23, 1987, abandoned.

[30] Foreign Application Priority Data

Jul. 28, 1986 [JP] Japan .................................. 61-175702
Dec. 5, 1986 [JP] Japan .................................. 61-288929

[51] Int. Cl.⁴ ............................................. G03B 27/52
[52] U.S. Cl. ..................................................... 356/401
[58] Field of Search ................. 356/400, 401; 250/567

[56] References Cited

U.S. PATENT DOCUMENTS 4,437,758  3/1981  Suzuki ................................. 356/401
4,725,737  2/1988  Nakota et al. ....................... 356/401

FOREIGN PATENT DOCUMENTS 61-134021  6/1986  Japan .

Primary Examiner—Richard A. Rosenberger
Attorney, Agent, or Firm—Shapiro and Shapiro

[57] ABSTRACT

An optical device for alignment in a projection exposure apparatus used for the alignment of a mask illuminated by exposure light of a predetermined wavelength and a substrate onto which the image of the pattern of the mask is projected through a projection optical system comprises a first alignment mark provided on the mask, a second alignment mark provided on the substrate, a light source emitting alignment light of the wavelength differing from that of the exposure light to irradiate the first and second alignment marks, a light condensing optical device provided between the mask and the light source for condensing the alignment light at at least two locations on the mask and at a position conjugate with the substrate with respect to the projection optical system under the alignment light, and a device for detecting the relative position of the two marks on the basis of optical information from the first and second alignment marks.

17 Claims, 6 Drawing Sheets

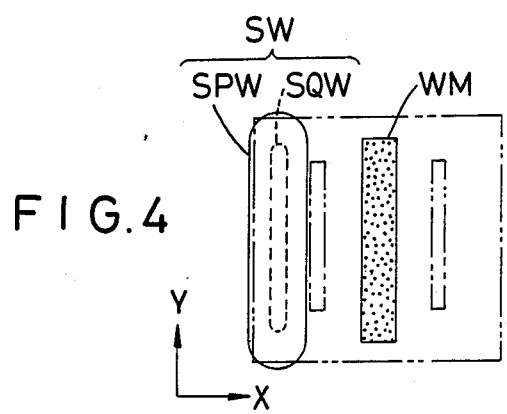
FIG. 4
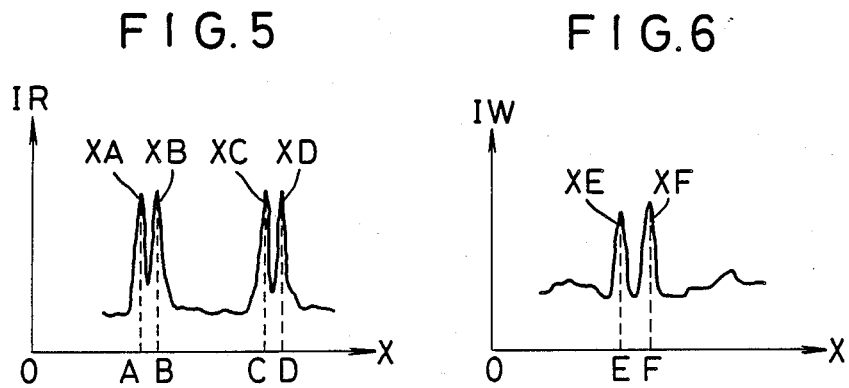
FIG. 5
FIG. 6
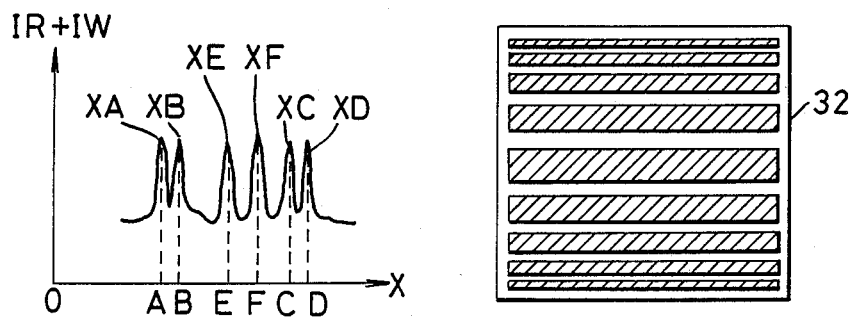
FIG. 7
FIG. 8

OPTICAL DEVICE FOR ALIGNMENT IN A PROJECTION EXPOSURE APPARATUS

This is a continuation application of Ser. No. 076,740 filed Jul. 23, 1987, now abandoned.

BACKGROUND OF THE INVENTION

1. Field of the Invention

This invention relates to a projection exposure apparatus, and in particular to improvements in the alignment system in the projection exposure apparatus.

2. Related Background Art

Of the alignment systems for the alignment of a mask (or a reticle) and a wafer effected in a projection exposure apparatus, in the system using alignment light of a wavelength differing from the wavelength of exposure light, the mask and the wafer do not always assume conjugate positions for the wavelength of the alignment light even if the mask and the wafer are provided at conjugate positions for the wavelength of the exposure light. For this reason, heretofore, there has been practised the countermeasure of placing the mask and the wafer in a conjugate relation even for the alignment light by the insertion of a correction lens or the insertion of an auxiliary mirror for changing the length of the optical path.

However, in the above-described countermeasure using the insertion of the correction lens or the change of the length of the optical path, the inserted position of the correction lens or the set position of the optical path is liable to shift, and there has also been an inconvenience that the alignment position, i.e., the position of the alignment mark of the mask, is fixed relative to the exposure optic axis and the position of the mark cannot be changed in conformity with the size of the pattern.

Also, when light of the same wavelength as the exposure light is used as the alignment light, there is an inconvenience that a photosensitive medium such as the photoresist on the wafer which is a semiconductive wafer is sensitized during alignment and the mark used for the alignment cannot be reused. Particularly, in a case where photoresist having mixed therewith a coloring matter which absorbs and does not reflect the exposure light is used as the photoresist, there occurs an inconvenience that alignment becomes difficult.

SUMMARY OF THE INVENTION

It is an object of the present invention to provide an optical device for alignment in a projection exposure apparatus which can accomplish alignment of good accuracy free of any relative deviation in the position setting of a mask and a wafer.

It is a further object of the present invention to provide an optical device for alignment in which alignment light of a wavelength differing from that of the exposure light can be condensed on a mask and a wafer in a projection exposure apparatus at the same time without the insertion of an auxiliary lens or the changeover of the length of the optical path by an auxiliary mirror.

The optical device for alignment according to the present invention is an optical device for alignment in a projection exposure apparatus which is used for the alignment of a mask irradiated with exposure light and a substrate onto which the image of the pattern of the mask is projected through a projection optical system, and includes alignment marks provided on the mask and the substrate, light source means for outputting alignment light of a wavelength differing from that of said exposure light to illuminate the alignment marks on both of the mask and the substrate, a light-transmitting optical system for condensing the alignment light from said light source means at the position of the mask conjugate with the substrate relative to the exposure light, with respect to the projection optical system, and a position conjugate with the substrate relative to the alignment light, and a detecting optical system for detecting reflected light from the alignment marks on both of the mask and the substrate.

According to the present invention, light of a wavelength differing from that of the exposure light is used as the alignment light. Therefore, the mask and substrate lying at conjugate positions relative to the exposure light are not conjugate relative to the alignment light, and the position conjugate with the substrate for the alignment light deviates from the mask by an amount corresponding to the amount of axial chromatic aberration of the projection optical system. So, in the present embodiment, double-focus optical means having focuses at two different locations on the optic axis for the incident light beam is provided in the illuminating optical system, and the design is such that the spacing between the two focuses of the double-focus optical means or the spacing between the conjugate positions thereof is equal to the amount of chromatic aberration of the projection optical system for the alignment light, whereby the alignment light may be condensed at the positions of both of the mask and the wafer. Thus the alignment light becomes double-focused and no special correction lens need be removably inserted in the alignment optical path between the mask and the wafer.

According to the present invention, by the use of alignment light of a wavelength differing from that of the exposure light, occurrence of the relative deviation between the mask and the wafer can be well prevented without the use of any correcting optical system and alignment of high accuracy can be accomplished and also, the mark on the wafer can be protected and further, a high throughput can be achieved.

Further, if the design is like a second embodiment of the present invention, a signal from the mark on the mask and a signal from the substrate can be separated by a beam splitter and received because the polarizing characteristics of a first focus and a second focus differ from each other, and thus the S/N ratio of the signal can be improved to better the accuracy of alignment and also, the construction of the detecting optical system is simplified and moreover, the loss of the laser light (for alignment) is small.

Other objects, features and effects of the present invention will become fully apparent from the following detailed description taken in conjunction with the accompanying drawings.

BRIEF DESCRIPTION OF THE DRAWINGS

FIG. 4 illustrates an example of a wafer mark used in the embodiment of FIG. 1.

FIG. 5 is a graph showing a photoelectric signal provided by reflected light from the reticle mark shown in FIG. 2.

FIG. 6 is a graph showing a photoelectric signal provided by reflected light from the wafer mark shown in FIG. 4.

FIG. 7 is a graph for illustrating the processing of the photoelectric signals provided by the reflected light from the reticle mark and the wafer mark.

FIG. 8 is a plan view schematically showing the linear pattern of a Fresnel zone plate used in the first embodiment of FIG. 1.

DESCRIPTION OF THE PREFERRED EMBODIMENTS

Figure 1:
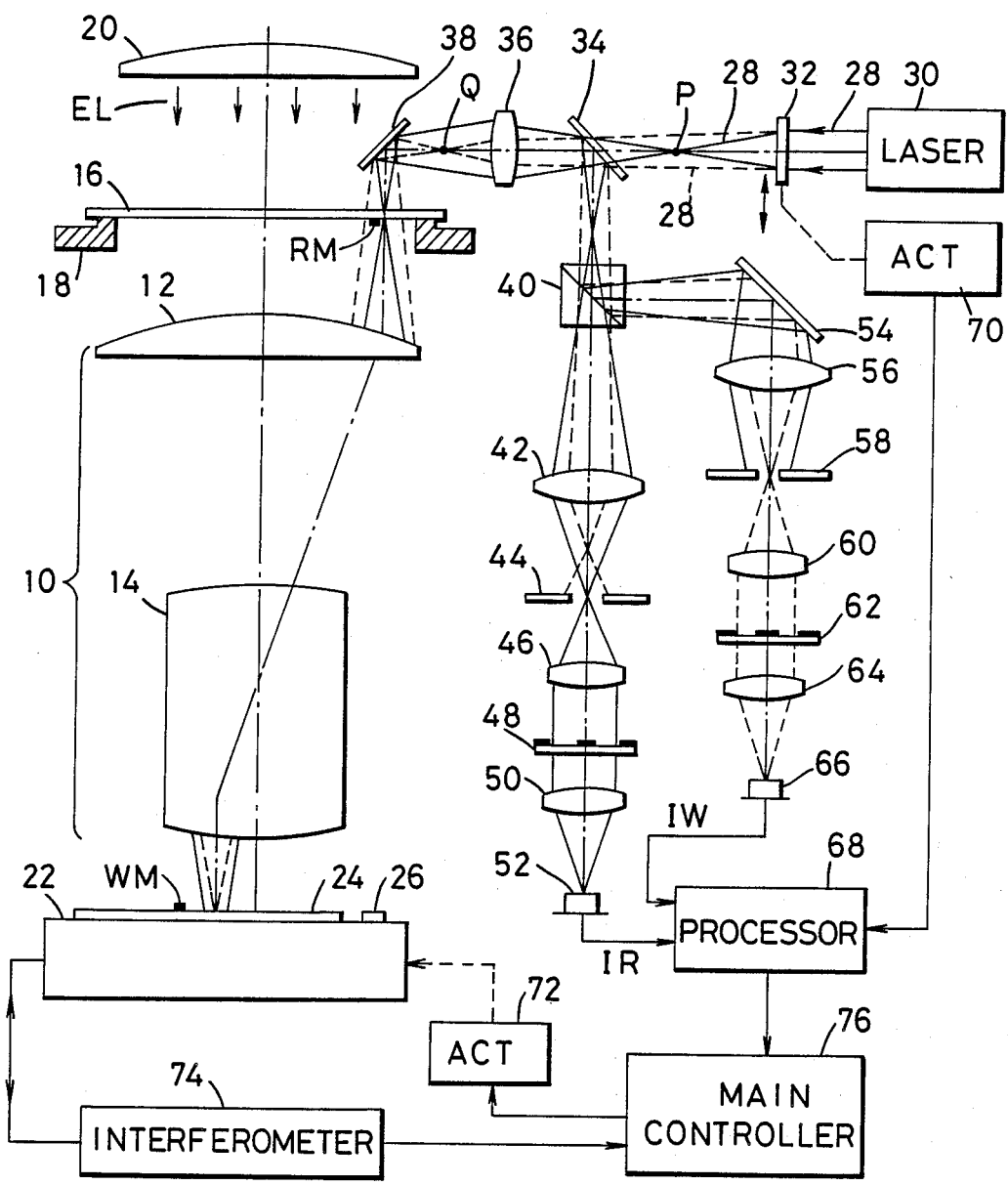
FIG. 1 shows the construction of a first embodiment of the present invention.

Referring to FIG. 1, there is shown a first embodiment of the projection exposure apparatus according to the present invention. In this Figure, a projection lens 10 is constructed as a bi-telecentric optical system by lens groups 12 and 14. Above the projection lens 10, a mask 16 called a reticle is disposed and held on a reticle stage 18. A condenser lens 20 is disposed above the reticle 16, and exposure light EL enters the reticle 16 trough the condenser lens 20. Below the projection lens 10, a wafer 24 placed on a stage 22 is disposed at a position conjugate with the reticle 16 with respect to exposure wavelength, and a fiducial mark 26 is provided on the stage 22 at a suitable location in the end portion thereof.

Laser light 28 which is alignment light of a wavelength differing from that of the exposure light EL is emitted from a laser light source 30 and enters the alignment mark portion of the reticle 16 through a zone plate 32, a beam splitter 34, an objective lens 36 and a mirror 38 which will all be described later in detail. The laser light 28 transmitted through the reticle 16 is further transmitted through the projection lens 10 and impinges upon the wafer 24, where it is reflected and returns along the forward path, and is again transmitted through the reticle 16 and enters the beam splitter 34 through the mirror 38 and the objective lens 36.

The laser light 28 reflected from the wafer is reflected by the beam splitter 34, enters a beam splitter 40, and is thereby divided into two light beams, one of which enters a first light-receiving element 52 through a lens 42, an aperture 44, a lens 46, a space filter 48 and a lens 50. The other divided light beam enters a second light-receiving element 66 through a mirror 54, a lens 56, an aperture 58, a lens 60, a space filter 62 and a lens 64.

The first light-receiving element 52 and the second light-receiving element 66 are connected to a signal processor 68, and the actuating unit 70 of the aforementioned zone plate 32 is also connected to the signal processor 68. The signal processor 68 is connected to a main controller 76 which in turn is connected to the actuating unit 72 of the stage 22 and an interferometer 74 for detecting the position of the stage 22.

The zone plate 32 is formed with a linear pattern for diffracting the incident light as shown, for example, in FIG. 8, and the laser light 28 transmitted therethrough comes into focus at two positions P and Q as shown in FIG. 1. In this example, a first focus (the condensing point of the first-order diffracted light) is P and a second focus (the condensing point of the second-order diffracted light) is Q. The light beam condensed at the first focus P is adapted to be again condensed on the reticle 16 as indicated by solid line in FIGS. 1 and 2, and the light beam condensed at the second focus Q is adapted to be again condensed on the wafer 24 as indicated by broken line in FIGS. 1 and 4. That is, the first focus P is conjugate with the reticle 16 with respect to the objective lens 36, and the second focus Q is conjugate with the wafer 24 with respect to the projection lens 10. The distance from the point Q to the reticle 16 corresponds to the amount of axial chromatic aberration of the projection lens 10 for alignment light.

When the zone plate 32 is driven by the actuating unit 70, the formed optical images vibrate on the reticle 16 and the wafer 24 and scan a mark RM on the reticle 16 and a mark WM on the wafer 24 at the same time, and the optical information from the pattern (mark) on the reticle 16 and the optical information from the pattern (mark) on the wafer 24 may be read by the first light-receiving element 52 and the second light-receiving element 66, respectively.

That is, reflected light from the alignment light projected onto the reticle 16 and the wafer 24 by the action of the Fresnel pattern of the zone plate 32 which is shown in FIG. 8 is reflected by the beam splitter 34 and is further divided by the beam splitter 40, and the divided light beams enter the light-receiving elements 52 and 66, respectively.

The lens 42, the aperture 44, the lens 46, the space filter 48 and the lens 50 for causing the reflected light to enter the first light-receiving element 52 are optically arranged so that the reflected light from the reticle 16 (the dark field image by diffracted and scattered light) is generally received on the first light-receiving element 52. Also, the mirror 54, the lens 56, the aperture 58, the lens 60, the space filter 62 and the lens 64 for causing the reflected light to enter the second light-receiving element 66 are optically arranged so that the reflected light from the wafer 24 (the dark field image by diffracted and scattered light) is generally received on the second light-receiving element 66. In the above-described light-receiving optical system, the aperture 44 is disposed at a position conjugate with the point P, i.e., the pattern (or the mark RM) of the reticle 16, and the aperture 58 is disposed at a position conjugate with the point Q, i.e., the pattern (or the mark WM) of the wafer 24.

The signal processor 68 detects the positional deviation between the alignment marks RM and WM from the detection outputs of the first light-receiving element 52 and the second light-receiving element 66, and outputs the result of the detection to the main controller 76.

The main controller 76 has the functions of effecting the drive control of the actuating unit 70 and determining the position of the stage 22 by the output of the interferometer 74, and controlling the position of the stage 22 on the basis of the output of the signal processor 68.

Operation of the above-described embodiment will now be explained with reference to FIGS. 2 to 7.

Figure 2:
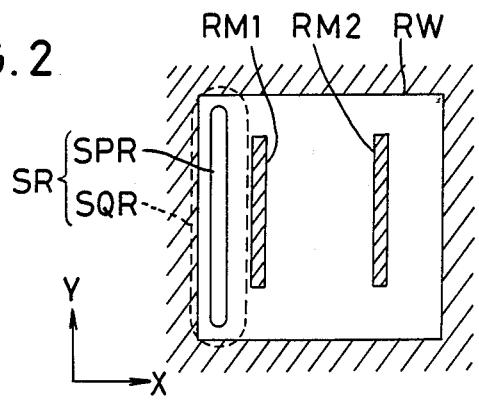
FIG. 2 illustrates an example of a reticle mark used in the embodiment of FIG. 1.

In FIG. 2, there is shown an example of the alignment mark RM on the reticle 16. Two reticle marks $RM_1$, and RM₂ are provided in a window RW. The alignment light SR which irradiates the reticle marks RM₁ and RM₂ includes alignment light SPR shown in solid line which is conjugate with the first focus P, which is in focus, and alignment light SQR from the second focus Q, which is not in focus.

Figure 3A:
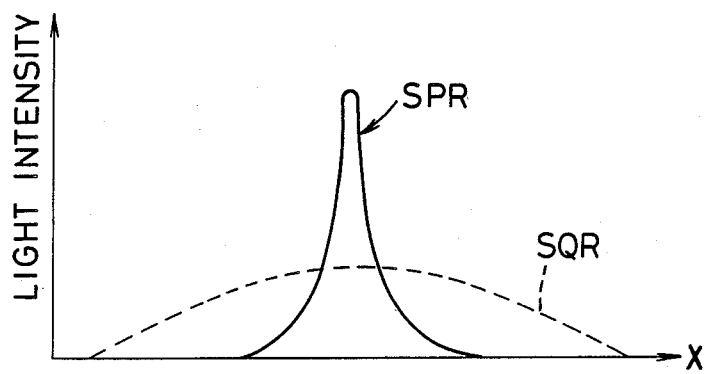
FIG. 3A is a graph showing the intensity distributions of alignment light for the reticle and the wafer, respectively, on the reticle.
Figure 3B:
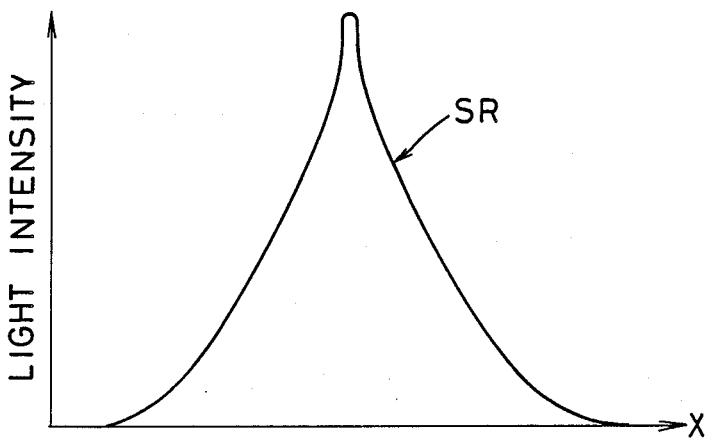
FIG. 3B is a graph showing the intensity distribution of the combined alignment light on the reticle.

FIGS. 3A and 3B show the intensity distributions of such alignment light SPR and SQR in X-direction in FIG. 2. FIG. 3A is a graph showing the intensity distribution of each alignment light on the reticle 16, and FIG. 3B is a graph showing the combined intensity distribution of the entire alignment light. As shown in FIG. 3A, the focused alignment light SPR intensely illuminates the narrow portion as indicated by solid line, whereas the defocused alignment light SQR assumes a wide distribution as indicated by broken line. Also, the combined light beam SR assumes an intensity distribution having a sharp peak in the central portion, as shown in FIG. 3B.

In FIG. 4, there is shown an example of the alignment mark on the wafer 24, and the wafer mark WM corresponds to that alignment mark. Also in FIG. 4, the projected images of the reticle marks RM₁ and RM₂ and the window RW are shown in dots-and-dash lines. The alignment light SW of the wafer mark WM includes alignment light SPW (see solid line) from the first focus P, which is not in focus, and alignment light SQW (see broken line) from the second focus Q, which is in focus. The intensity distributions of such alignment light are in a relation converse to the case of FIG. 2, and the alignment light SQW on the wafer corresponds to SPR of FIG. 2.

When the zone plate 32 is moved in the direction of the arrow in FIG. 1 by the actuating unit 70, the linear Fresnel pattern is displaced in a direction perpendicular to the arrangement of stripes, and in FIG. 2, the alignment light SR scans the reticle-marks RM₁ and RM₂ in X-direction, whereby the light is intensely reflected (scattered) from the edge portions of these marks, and a photoelectric signal IR of a waveform having four peaks as shown in FIG. 5 is obtained by the first light-receiving element 52. The centers of the reticle marks RM₁ and RM₂ can be found by finding the centers of the peaks XA and XB of the photoelectric signal IR and the centers of the peaks XC and XD of said signal IR, and then finding the center between said centers. The aperture 44 is not conjugate with the wafer surface and therefore, the reflected light from the wafer surface is almost intercepted by this aperture 44.

On the other hand, when the alignment light SW scans the wafer mark WM in X-direction in FIG. 4 by the driving of the aforedescribed zone plate 32, the light is intensely reflected (scattered) from the edge portion of said mark and a photoelectric signal IW of such a waveform as shown in FIG. 6 is obtained by the second light-receiving element 66. The center of the wafer mark WM can be found from the centers of the peaks XE and XF of the photoelectric signal IW. The aperture 58 is not conjugate with the reticle surface and therefore, the reflected light from the reticle surface is almost intercepted by this aperture 58.

The photoelectric signals IR and IW obtained in the manner described above are input to the signal processor 68, in which they are added together and become an addition signal IR +IW shown in FIG. 7, and this signal is input to the main controller 76. The positional deviation d between the reticle 16 and the wafer 24 is found from said addition signal. If, for example, the positions of the peaks of the photoelectric signal IR produced at the edges of the reticle marks RM₁ and RM₂ are A, B, C and D as shown in FIG. 7 and the positions of the peaks of the photoelectric signal IW produced at the edge of the wafer mark WM are E and F, the amount of deviation d is $$d=\{2(E+F)-(A+B+C+D)\}/4.$$

The positional deviation between the reticle 16 and the wafer 24 found in the manner described above is fed back by the main controller 76, and the stage 22 is driven by the actuating unit 72, whereby alignment is accomplished.

Figure 9:
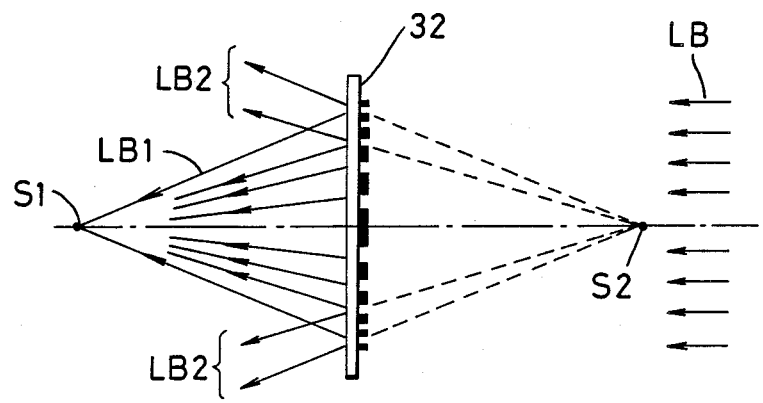
FIG. 9 illustrates a cross-section of a zone plate having a real focus and a virtual focus.
Figure 10:
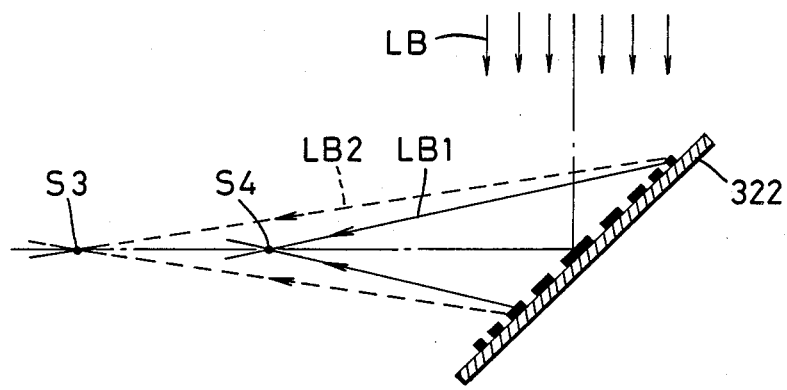
FIG. 10 illustrates a cross-section of a reflection type zone plate.

Reference is now had to FIGS. 9 and 10 to describe a modification of the zone plate.

The Fresnel pattern of the zone plate 32 produces minus-order light as shown in FIG. 9. Of the alignment light LB incident from the right of FIG. 9, plus-order light LB1 is focused at a primary focus S1 and minus-order light LB2 is focused at a secondary focus S2. In this case, S1 corresponds to the point P in FIG. 1 and S2 corresponds to the point Q in FIG. 1, and accordingly, the spacing between the focus S1 and the reticle 16 conjugate with the focus S2 may be made to correspond to the amount of chromatic aberration of the projection lens 10.

FIG. 10 shows a reflection type zone plate 322. Of the alignment light LB incident from above, the firstorder light LB1 of plus-order light is focused at a primary focus S4 and for example, the second-order light LB2 of plus-order light is focused at a secondary focus S3. In this case, S4 corresponds to the point P in FIG. 1 and S3 corresponds to the point Q in FIG. 1 and accordingly, the spacing between the focus S3 and the reticle 16 conjugate with the focus S4 may likewise be made to correspond to the amount of chromatic aberration of the projection lens 10.

As described above, according to the first embodiment, the Fresnel pattern plate 32 is utilized to focus (image) the alignment light at a plurality of positions and the spacing between one focused position and the position conjugate with the other focused position is made to correspond to the amount of chromatic aberration of the projection lens 10 and therefore, offset (deviation) of alignment caused by the vibration of the laser or the variation with time can be eliminated well, and the use of light of non-exposure wavelength as the alignment light permits the same marks to be protected and repeatedly used.

Figure 11:
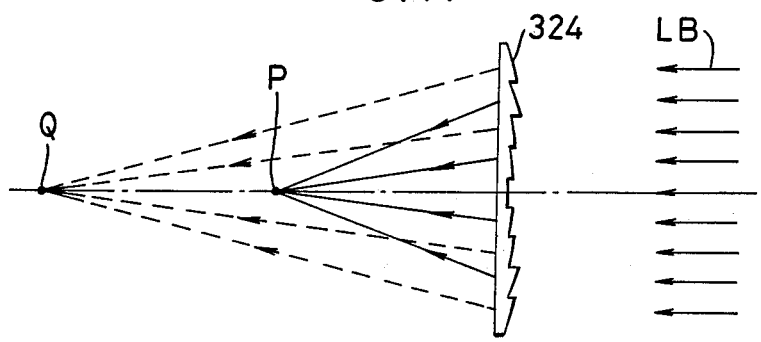
FIGS. 11 and 12 illustrate cross-sections of double-focus Fresnel lenses, respectively, used instead of the zone plate of FIG. 8.
Figure 12:
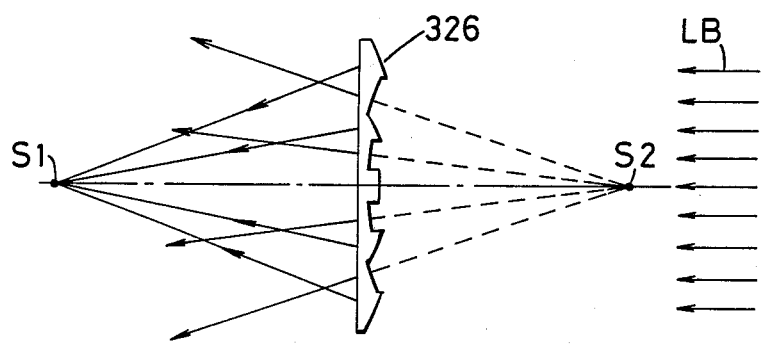

The fiducial mark 26 fixedly formed on the stage 22 can be utilized to accomplish the base line measurement, i.e., the measurement of the spacing between a wafer alignment microscope, not shown, for the global alignment of the wafer and a TTL type microscope for the alignment of the mask and wafer, and reticle alignment. Also, instead of the zone plate, use may be made of Fresnel type cylindrical double-focus lenses 324 and 326 as shown in FIGS. 11 and 12.

A second embodiment of the present invention will now be described in detail with reference to FIGS. 13 and 14.

Figure 13:
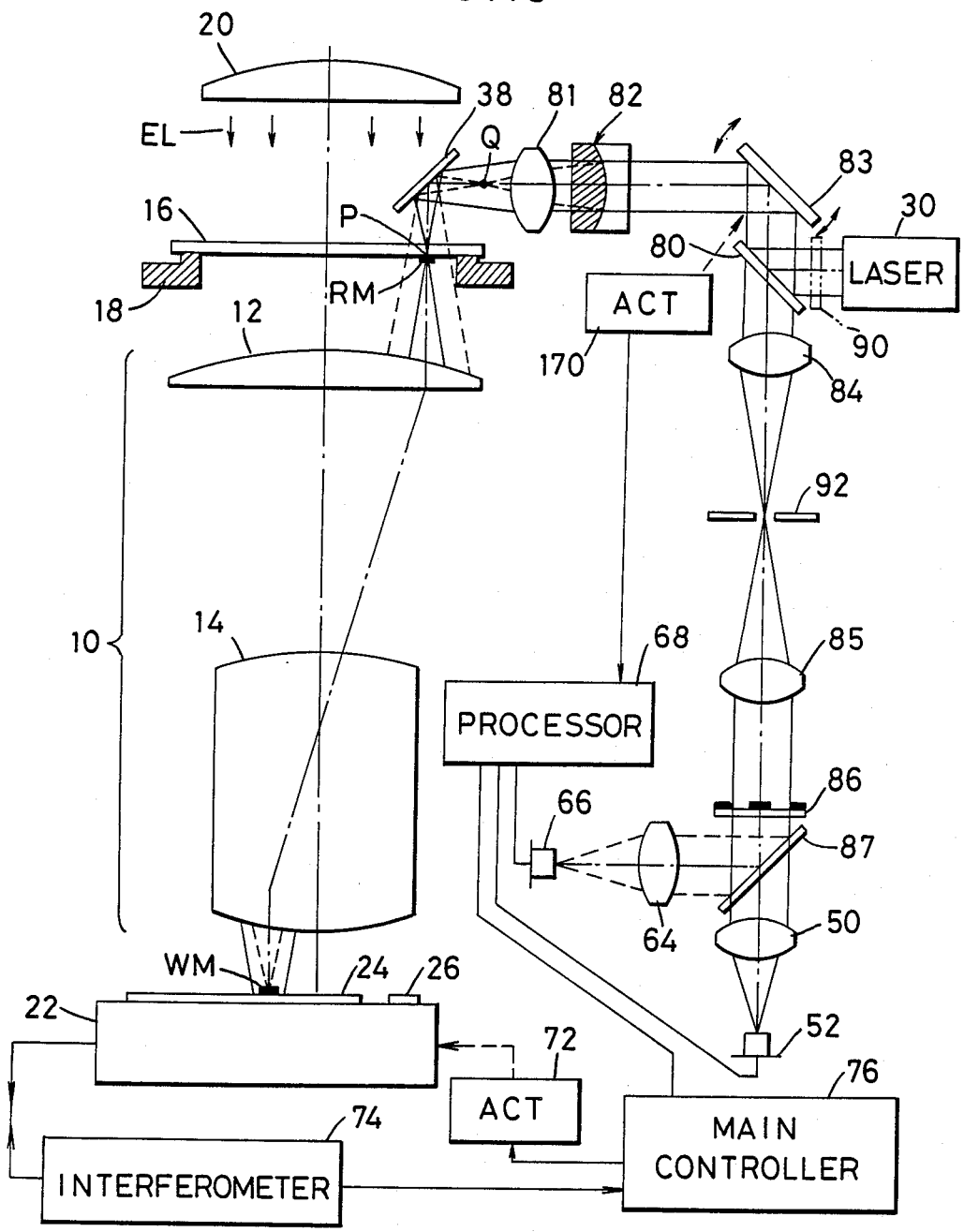
FIG. 13 shows the construction of a second embodiment of the present invention.

In FIG. 13, the portions other than a light-projecting optical system for providing double focuses P and Q and a light-receiving optical system for alignment are similar in construction to those of the first embodiment shown in FIG. 1 and therefore, portions functionally similar to those in FIG. 1 are given similar reference numerals and need not be described.

The laser light from a laser light source 30 is reflected by a beam splitter 80 and enters, as polarized components (P-polarized light and S-polarized light) whose planes of polarization differ from each other, the alignment mark portion of the reticle 16 through a scanner 83, a double-focus lens 82 utilizing double refraction, an objective lens 81 (which may desirably be telecentric) and a mirror 38. Further, the laser light transmitted through the reticle 16 is transmitted through the projection lens 10 and impinges upon the wafer 24, where it is reflected and returns along the forward path, and is again transmitted through the reticle 16 and enters the beam splitter 80 through the objective lens 81, the double-focus lens 82 and the scanner 83 provided at a position conjugate with the pupil of the projection lens 10. The pupil position at which the scanner 83 lies is a position common to the P-polarized light and the S-polarized light due to the above-described construction.

Now, the laser light including the P-polarized light and the S-polarized light transmitted through the beam splitter 80 enters a polarizing beam splitter 87 through lenses 84 and 85 and a space filter 86 (for cutting, for example, the regularly reflected light) disposed conjugately with the pupil plane, i.e., the scanner 83. The polarized light whose direction of polarization is parallel to the incidence surface is transmitted through the polarizing beam splitter 87 and enters a first light-receiving element 52 through a lens 50, and the polarized light whose direction of polarization is perpendicular to the incidence surface is reflected by the polarizing beam splitter 87 and enters a second light-receiving element 66 through a lens 64. The first light-receiving element 52 and the second light-receiving element 66 are connected to the signal processor 68, and the actuating unit 170 of the scanner 83 is also connected to the signal processor 68.

Figure 14:
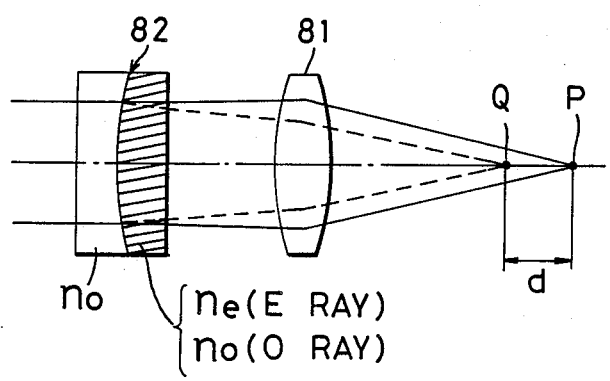
FIG. 14 shows the construction of a double-focus optical system used in the embodiment of FIG. 13.

Of the above-described components, the double-focus lens 82 and the objective lens 81 are shown on an enlarged scale in FIG. 14. The portion of the double-focus lens 82 which is indicated by hatching is formed of a crystal having a refractive index Ne for the extraordinary (E) ray (whose polarized plane is perpendicular to the plane of the drawing sheet) and a refractive index No for the ordinary (0) ray (whose polarized plane is parallel to the plane of the drawing sheet), and the portion of the double-focus lens 82 which is not depicted by hatching is formed of ordinary glass having a refractive index No. Accordingly, the extraordinary (E) ray is refracted on the boundary surface in accordance with the curvature thereof, while the ordinary (0) ray travels rectilinearly. As a result, light of one polarization is imaged at the first focus P by the objective lens 81 and light of the other polarization is imaged at the second focus Q as indicated by broken lines. The first focus P lies on the reticle 16 and the second focus Q is conjugate with the wafer 24 as in the first embodiment.

The actuating unit 170 is designed to drive the scanner 83, and when the scanner 83 is vibrated thereby, two differently polarized laser light components are imaged on the reticle 16 and the wafer 24, respectively, and vibrate as light spots, respectively. At that time, to make the light spots into a slit-like shape as in the first embodiment, a cylindrical lens 90 or the like may be provided in the optical path between the laser light source 30 and the beam splitter 80. When these light spots scan the patterns (marks) on the reticle 16 and the wafer 24, respectively, the first light-receiving element 52 and the second light-receiving element 66 receive the optical information (scattered light and diffracted light) from those patterns. At this time, the reflected light from the alignment light applied to reticle 16 and the wafer 24 by the characteristic of the double-focus lens 82 is transmitted through the beam splitter 80 and further, the light having one polarized characteristic is transmitted through the polarizing beam splitter 87 and enters the first light-receiving element 52, and the light having the other polarized characteristic is reflected by the polarizing beam splitter 87 and enters the second light-receiving element 66. Also, as in the first embodiment, the optical system such as the lenses 50 and 64 forms the images of the reflected light from the reticle and wafer (the dark field images or the Fourier images on the pupil plane) on the light-receiving surfaces of the light-receiving elements 52 and 66, respectively. The detecting unit including the light-receiving elements 52 and 66 is substantially similar to that in the first embodiment and therefore need not be described.

In the above-described second embodiment, the double-focus element 82 and the objective lens 81 together constitute a part of the light-transmitting optical system of the present invention, and at the same time, they also form a part of the light-receiving system. Also, as the combination of the double-focus element 82 and the objective lens 81, use may be made of a double-focus optical system comprising a combination of a double-focus lens group comprising a diverging lens and a converging lens each formed of a double-refraction element such as rock crystal and an objective lens system as disclosed, for example, in U.S. Pat. No. 4,566,762 (issued Jan. 28, 1986).

In the second embodiment, the design is such that the beam emitted from the laser light source 30 passes through the scanner 83 and again passes through the scanner 83 to the light-receiving elements 52 and 66 and therefore, the optic axis of the light beam travelling from the scanner 83 toward each light-receiving element becomes stationary irrespective of the displacement of the scanner. Accordingly, a field stop 92 may be disposed at the imaging position in the optical path to shape the spot image, whereby the S/N ratio of detection can be improved.

While embodiments of the present invention have been described above, the photoresist may be sufficiently low in sensitivity to the alignment light to be exposed thereto and the alignment need not always be light which does not sensitize the photoresist, but may be light which will sensitize the photoresist if the latter is exposed to the light for a long time.

I claim:
1. A device for aligning an object provided with first alignment mark means and a substrate provided with second alignment mark means, comprising:
   means for disposing said object and said substrate on first and second planes, respectively;
   an imaging optical system provided between said first and second planes so that said first and second planes are substantially conjugate with each other with respect to said imaging optical system under a first wavelength;
   means for radiating an energy beam having a second wavelength differing from said first wavelength;
   optical means, provided between said radiating means and said first plane, for condensing a first beam part separated from said energy beam onto said first plane to form a beam spot on said first alignment mark means and condensing a second beam part separated from said energy beam onto said second plane in cooperation with said imaging optical system to form a beam spot on said second alignment mark means; and means for detecting the relative position of said object and said substrate on the basis of optical information from said first and second alignment mark means.

2. A device according to claim 1, wherein said detecting means includes first and second aperture stops disposed at respective positions substantially conjugate with said first and second planes under said second wavelength, respectively, and includes first and second detectors receiving first and second beam parts passing through said first and second aperture stops, respectively.

3. A device according to claim 1, wherein said optical means includes a multifocus optical system for condensing said first beam part at a first position and condensing said second beam part at a second position differing from said first position in the direction of an optic axis, and objective lens means for condensing said first beam part condensed at said first position onto said first plane and condensing said second beam part condensed at said second position onto said second plane in cooperation with said imaging optical system.

4. A device according to claim 3, wherein said multifocus optical system includes a zone plate member having a Fresnel pattern for diffracting light.

5. A device according to claim 3, wherein said multifocus optical system includes a double-focus Fresnel lens having two curved surfaces of different curvatures alternately.

6. A device according to claim 3, wherein said multifocus optical system includes means for separating said beam parts utilizing double refraction.

7. A device according to claim 3, wherein said multifocus optical system includes a double refraction lens means for separating said energy beam into an ordinary ray and an extraordinary ray whose polarized planes are perpendicular to each other.

8. A device according to claim 3, wherein said multifocus optical system separates said energy beam into polarized components and condenses one of said components at said first position and another of said components at said second position.

9. A device according to claim 8, wherein said detecting means includes first detector means for receiving said one polarized component from said object through said optical means and second detector means for receiving said other polarized component from said substrate through said optical means.

10. A device for aligning an object provided with first alignment mark means and a substrate provided with second alignment mark means, comprising:
means for disposing said object and said substrate on first and second planes, respectively;
an imaging optical system provided between said first and second planes so that said first and second planes are substantially conjugate with each other with respect to said imaging optical system under a first wavelength;
radiation means for radiating an energy beam having a second wavelength differing from said first wavelength;
optical means, provided between said radiating means and said first plane, for condensing a first beam part separated from said energy beam onto said first plane to form a beam spot on said object and condensing a second beam part separated from said energy beam onto said second plane in cooperation with said imaging optical system to form a beam spot on said substrate;
means for shifting said energy beam so that said beam spots are simultaneously moved on said first and second planes to scan said first and second alignment mark means, respectively; and
means for detecting the relative position of said object and said substrate on the basis of optical information from said first and second alignment mark means.

11. A device according to claim 10, wherein said optical means includes a multifocus optical system for condensing said first beam part at a first position and condensing said second beam part at a second position differing from said first position in the direction of an optic axis, and objective lens means for condensing said first beam part condensed at said first position onto said first plane and condensing said second beam part condensed at said second position onto said second plane in cooperation with said imaging optical system.

12. A device according to claim 10, wherein said shifting means includes a reflecting surface disposed between said radiation means and said optical means and moved to vary the angle of reflection of said reflecting surface.

13. A device according to claim 12, wherein said reflecting surface is disposed at a position substantially conjugate with a pupil of said imaging optical system.

14. A device according to claim 12, wherein said detecting means includes light-receiving means for receiving said optical information reflected by said reflecting surface.

15. A device according to claim 14, wherein said light-receiving means includes an imaging lens system, a field stop provided on an imaging plane of said imaging lens system, and a detector for receiving said optical information passed through said field stop.

16. A device for aligning an object provided with first alignment mark means and a substrate provided with second alignment mark means, comprising:
means for disposing said object and said substrate on first and second planes, respectively;
an imaging optical system provided between said first and second planes so that said first and second planes are substantially conjugate with each other with respect to said imaging optical system under a first wavelength;
means for radiating an energy beam having a second wavelength differing from said first wavelength;
optical means, provided between said radiating means and said first plane, for condensing a first beam part separated from said energy beam onto said first plane to form a beam spot on said first alignment mark means and condensing a second beam part separated from said energy beam onto said second plane in cooperation with said imaging optical system to form a beam spot on said second alignment mark means; and
means for detecting the relative position of said object and said substrate on the basis of optical information from said first and second alignment mark means;

said optical means being provided between said first plane and said detecting means, and said detecting means receiving said optical information passed through said optical means.

17. A device according to claim 16, wherein said detecting means includes an imaging lens system adapted to condense said optical information at an imaging plane, a field stop provided on said imaging plane of said imaging lens system, a first detector adapted to receive said optical information passed through said field stop from said first alignment mark means, and a second detector adapted to receive said optical information passed through said field stop from said second alignment mark means.

* * * * *